(12) United States Patent
Seidler

(10) Patent No.: US 8,497,429 B2
(45) Date of Patent: Jul. 30, 2013

(54) PLANAR CONTACT WITH SOLDER

(75) Inventor: Jack Seidler, Bayside, NY (US)

(73) Assignee: Interplex Industries, Inc., College Point, NY (US)

( * ) Notice: Subject to any disclaimer, the term of this patent is extended or adjusted under 35 U.S.C. 154(b) by 532 days.

(21) Appl. No.: 12/727,146

(22) Filed: Mar. 18, 2010

(65) Prior Publication Data

US 2010/0236815 A1 Sep. 23, 2010

Related U.S. Application Data

(60) Provisional application No. 61/161,231, filed on Mar. 18, 2009.

(51) Int. Cl.
*H01B 5/00* (2006.01)
*H05K 1/11* (2006.01)
*H01R 12/00* (2006.01)
*H01R 4/18* (2006.01)
*H01R 4/02* (2006.01)

(52) U.S. Cl.
USPC .......... 174/126.1; 174/263; 439/83; 439/867; 439/876

(58) Field of Classification Search
USPC ............... 174/126.1, 263; 439/83, 867, 876
See application file for complete search history.

(56) References Cited

U.S. PATENT DOCUMENTS

| | | | | |
|---|---|---|---|---|
| 3,750,252 A | * | 8/1973 | Landman | 428/571 |
| 4,597,628 A | * | 7/1986 | Seidler | 439/876 |
| 4,697,865 A | * | 10/1987 | Seidler | 439/861 |
| 4,802,862 A | * | 2/1989 | Seidler | 439/83 |
| 5,334,059 A | * | 8/1994 | Seidler | 439/876 |
| 5,609,491 A | | 3/1997 | Cooper et al. | |
| 5,667,412 A | * | 9/1997 | Takahashi et al. | 439/751 |
| 6,494,754 B2 | * | 12/2002 | Cachina et al. | 439/876 |
| 6,834,791 B2 | * | 12/2004 | Seidler | 228/255 |
| 7,159,312 B2 | * | 1/2007 | Mongold et al. | 29/843 |
| 2002/0023773 A1 | | 2/2002 | Khandros | |
| 2005/0124148 A1 | | 6/2005 | Tuominen | |

* cited by examiner

*Primary Examiner* — Timothy Thompson
*Assistant Examiner* — Sherman Ng
(74) *Attorney, Agent, or Firm* — Preti Flaherty Beliveau & Pachios LLP

(57) ABSTRACT

A method of fixing reflowable elements on electrical contacts. The method includes providing a strip having a number of electrical contacts, each contact including a contact body and a tail portion extending away from the contact body. The tail portions of the contacts are then disposed adjacent an elongate reflowable member. The elongate reflowable member is pushed onto the tail portions of the plurality of contacts. Subsequently, the elongate reflowable member is cut into a plurality of separate reflowable elements, each reflowable element corresponding to one of the tail portions. The electrical contacts with the reflowable element attached thereto are separated from the strip.

11 Claims, 7 Drawing Sheets

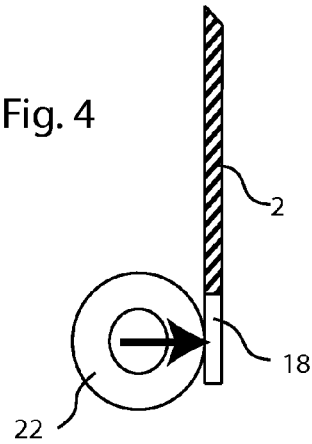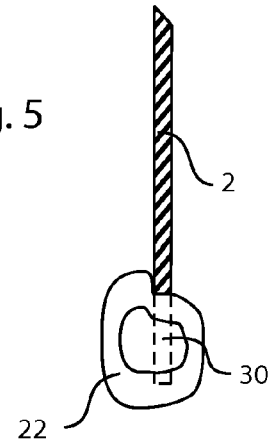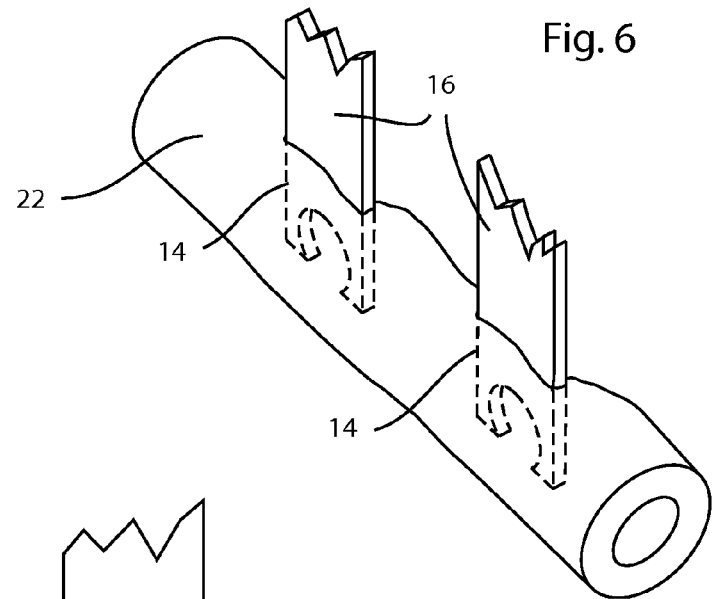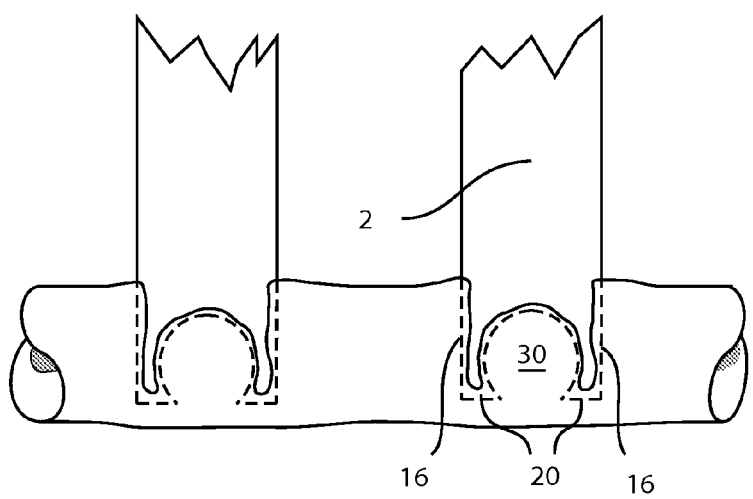

US 8,497,429 B2

PLANAR CONTACT WITH SOLDER

RELATED APPLICATION

This application is a utility patent application based upon a previously filed U.S. Provisional Patent Application Ser. No. 61/161,231 filed on Mar. 18, 2009, the benefit of which is hereby claimed under 35 U.S.C. §119(e) and incorporated herein by reference.

FIELD

The present invention relates to electrical contacts for providing an electrical connection between first and second electronic components, and more specifically relates to electrical contacts having a reflowable element disposed thereon.

BACKGROUND

Electrical connectors are frequently attached to a substrate, such as a printed circuit board (PCB), using a Ball Grid Array (BGA) type of electrical connection. The BGA includes a plurality of solder balls that are used to connect electrical contacts of the connector to the PCB. A typical BGA connector is connected to an array of electrical contact pads or traces disposed about the surface of the substrate. The solder balls are attached to the contact pads by first applying a resin flux to the electrical contact pads, positioning the solder balls onto the electrical contact pads, and running the connector through a reflow furnace. During the reflow process the solder balls are held in position by the flux and wetted onto the electrical contact pads. In addition to holding the solder balls in position, the flux promotes the wetting of the solder balls to the contact pads and chemically cleans the contact pad surfaces.

However, the small solder balls in a BGA connection produce only a short connection height between the electrical contacts of the connector and the contact pads of the substrate. These short connections are subject to high mechanical stress if any movement occurs between the connector and the substrate. As a result, the connection between the connector and the substrate is vulnerable to failing as a result of the solder connection breaking due to stress.

One approach to apply solder balls on the contacts involves reflowing solder, placing the liquid solder on the contact, and allowing the solder to cool to form a ball disposed on the contact. However, this is a very complex and time consuming process. The requirement to heat and cool the solder as it is applied to the contacts can be time consuming.

SUMMARY

The present invention provides a method of fixing reflowable elements on electrical contacts. The method includes providing a strip having a plurality of electrical contacts, each contact including a contact body and a tail portion extending away from the contact body. The tail portions of the plurality of contacts are then disposed adjacent an elongate reflowable member. The elongate reflowable member is pushed onto the tail portions of the plurality of contacts. Subsequently, the elongate reflowable member is cut into a plurality of separate reflowable elements, each reflowable element corresponding to one of the tail portions. The electrical contacts with the reflowable element attached thereto are separated from the strip.

The present invention also provides a contact strip with a plurality of electrical contacts each having a reflowable element disposed on a tail portion of the contact. In one embodiment, the electrical contact includes first and second legs disposed around an opening in the contact.

BRIEF DESCRIPTION OF THE DRAWINGS

Exemplary embodiments of the present invention will be described in the following and are schematically shown in the drawings, in which:

FIGS. 2-4 show the tail portions of the electrical contacts of FIG. 1 disposed adjacent an elongate reflowable member;

FIGS. 5 and 6 illustrate an embodiment of a method of attaching the reflowable member on the tail portions of FIG. 1;

FIG. 7 shows a rear view of the reflowable member and tail portions of FIGS. 5 and 6 illustrating the connection between the reflowable member and tail portions;

DETAILED DESCRIPTION

Figure 1:
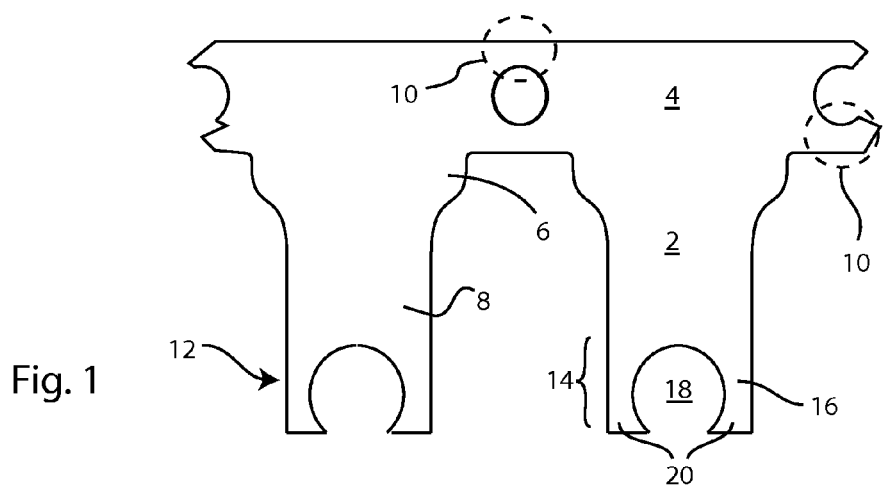
FIG. 1 shows electrical contacts in accordance with an embodiment of the present invention attached to a strip.

FIG. 1 shows an embodiment of the present invention with two electrical contacts 2 attached to a strip 4 of electrical contacts. Preferably, the contact strip 4 is long and has a number of electrical contacts 2 attached thereto. Each of the electrical contacts 2 has a contact body 6 and a tail portion 8 extending from the contact body and typically extending in a direction away from the strip 4. Each electrical contact 2 has one or more breakaway attachment points 10 to the contact strip 4. Thus, the electrical contacts 2 can be detached from the strip 4 and used individually. In the illustrated embodiment, the length of the strip 4 is made up by a portion of the contact bodies 6 themselves. In other words, the contact bodies 6 are attached directly together at the attachment points 10 and the series of attached contact bodies 6 define the strip 4. Alternatively, the strip 4 can be a separate piece with the contact bodies 6 attached thereto at the attachment points 10. The strip 4 and the contacts 2 can be formed in a single plane, as shown in FIG. 1. For example, the contacts 2 and the strip can be stamped from a sheet of metal or a metal foil. Planar contact strips can be advantageous because of high reliability in their manufacture and low production costs.

In use, the electrical contacts 2 serve to electrically connect first and second electrical components. For example, the contact body 6 of the electrical contact 2 can be held in a housing of the first electrical component, such as an electrical connector or an electronic package, in electrical communication with a terminal of the first component. The tail portion 8 of the contact 2 extends out from the housing such that a free end 12 of the tail portion 8 is disposed at a remote end of the contact 2 from the housing. The free end 12 of the tail portion 8 is configured to be electrically connected to a corresponding terminal of the second electrical component, such as a contact pad of a substrate. To form the attachment between the free end 12 of the tail portion 8 and the contact pad, solder is used to mechanically bond and electrically connect the tail portion 8 and the contact pad. In accordance with the present invention, the reflowable material is disposed on the tail portion 8 of the contact in advance of connecting the electrical components. Accordingly, the first component can be packaged and transported with reflowable material disposed on its contacts. Moreover, the reflowable material can be placed on the contacts 2 before they are disposed in the housing of the first electrical component.

In accordance with embodiments of the present invention, the reflowable material is disposed on the tail portions 8 of the contacts 2 by pushing the reflowable material onto the contacts 2. Each of the tail portions 8 include a holding section 14 that is adapted to hold the reflowable material on the contact once it has been pushed onto the tail portion 8. In the embodiment shown in FIG. 1, the holding section 14 includes two legs 16 disposed on either side of a circular opening 18. After the reflowable material is pushed onto the holding section 14 of the contacts, the feet 20 of each leg 16 help to securely retain the reflowable material on the tail portion 8. As described in more detail below, the reflowable material that is pushed through the opening 18 is partially surrounded by the legs 16 and their respective feet 20 ensuring that the reflowable material does not slip off the contacts 2. The feet 20 serve as a catch to hold the reflowable material in place by being wider than a central portion of the legs, which act as a narrow connection. Thus, the reflowable material will not slip off the contact 2 because the catch is wider than the narrow connection, which is disposed on the tail portion 8 between the catch and the contact body 6.

An example of a reflowable material that is suitable with the present invention is solder. Solder can be used as the reflowable material because it will reflow at elevated temperatures that are below the melting point of the contacts 2 and surrounding components. For example, depending on the particular material, solder can have a melting point in a range between 90° C. and 450° C. Accordingly, the solder can reflow and connect the contact 2 to a substrate terminal or contact pad without altering or melting the contact 2, the substrate terminal, the substrate or any structural element near the solder, such as a housing holding the contact 2. An exemplary suitable solder material is composed of a mixture of tin and lead. Due to regulatory pressure to reduce the amount of lead used in electrical components, it may be advantageous to use a lead-free solder. Examples of lead-free solders frequently include tin combined with other components such as copper, silver, bismuth, indium, zinc and antimony. Many suitable solders have a reflow temperature that is below 220° C.

Figure 2:
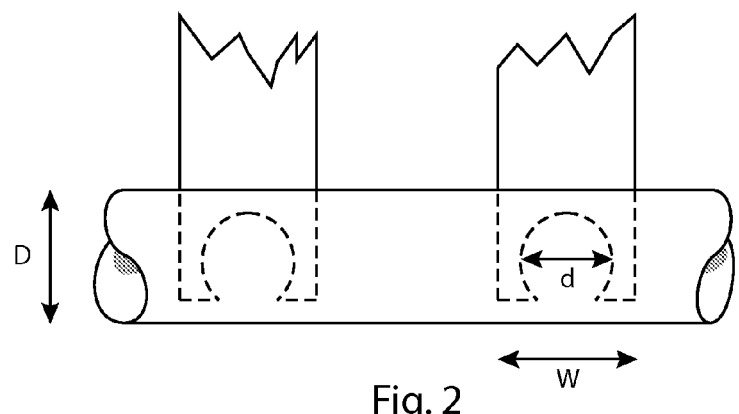
Figure 3:
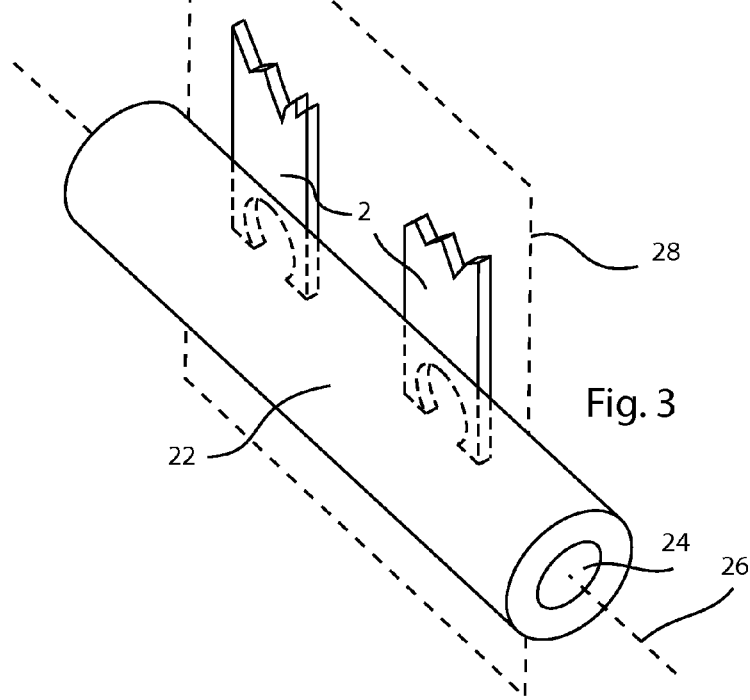

FIGS. 2-7 illustrate solder being pushed onto the electrical contacts 2 of FIG. 1 from the side. In FIGS. 2 and 3 an elongate solder member 22 is shown disposed in front of the electrical contacts 2. The illustrated elongate solder member 22 may be in the form of a solder wire with a flux core 24. As shown, the elongate solder member 22 is positioned so as to extend along an axis 26 that is offset from and parallel with the plane 28 of the contacts 2. The elongate solder member 22 is then pushed onto the contacts 2, as depicted by the motion arrow in FIG. 4, such that the axis 26 of the solder member 22 is aligned or nearly aligned with the plane of the contacts 2. Alternatively, the contacts 2 can be pushed onto the solder member 22. As a result of the solder member being pushed onto the contacts 2, a portion of the solder member 22 and the flux core 24 is inserted through the opening 18 in the holding section 14 of the solder member. Accordingly, the feet 20 can hold a central portion 30 of the solder that is disposed within the opening 18 and prevent the solder from slipping off the tail portion 8. To promote a secure connection between the contacts 2 and the solder member 22, the holding sections 14 are preferably sized to fit within the solder member 22. The envelopment of the holding sections 14 within the solder member 22 is aided by the parallel orientation of the axis of the solder member 26 with the plane 28 of the contacts 2. However, the secure engagement between the holding section 14 and solder member 22 can be further aided by making the features of the holding sections 14 small enough to fit within the solder member. For example, the diameter d of the opening 18 may be smaller than the diameter of the solder member 22, shown in FIG. 2. Moreover, the width W of the entire free end 12 of the tail portion 8 can be smaller than the diameter D of the solder member. As a result, the entire holding section 14 can securely engage with the solder member 22.

Depending on the malleability of the solder, parts of the solder may be pushed around the solder contacts 2 partially encompassing the legs and feet, as shown in FIG. 7. By encompassing the legs 16 and feet 20 of the contacts 2, the solder is less likely to be dislodged from its connection with the holding section 14 of the contact 2. The malleability of the solder member 22 is partially determined by the constituent material of the solder. In addition, the malleability of the solder can be increased by raising its temperature. Accordingly, the act of pushing the solder member 22 onto the contacts 2 can be carried out at an elevated temperature. Thus, the solder member 22 will more easily be pushed onto the tail portions 8 of the contacts 2 and will encompass the legs 16 and feet 20 more readily. Preferably, the elevated temperature is above ambient temperature but below the reflow temperature of the solder. For example, depending on the type of solder used, the solder member 22 can be pushed onto the contacts 2 at an elevated temperature that is substantially below 180° C.

Figure 8:
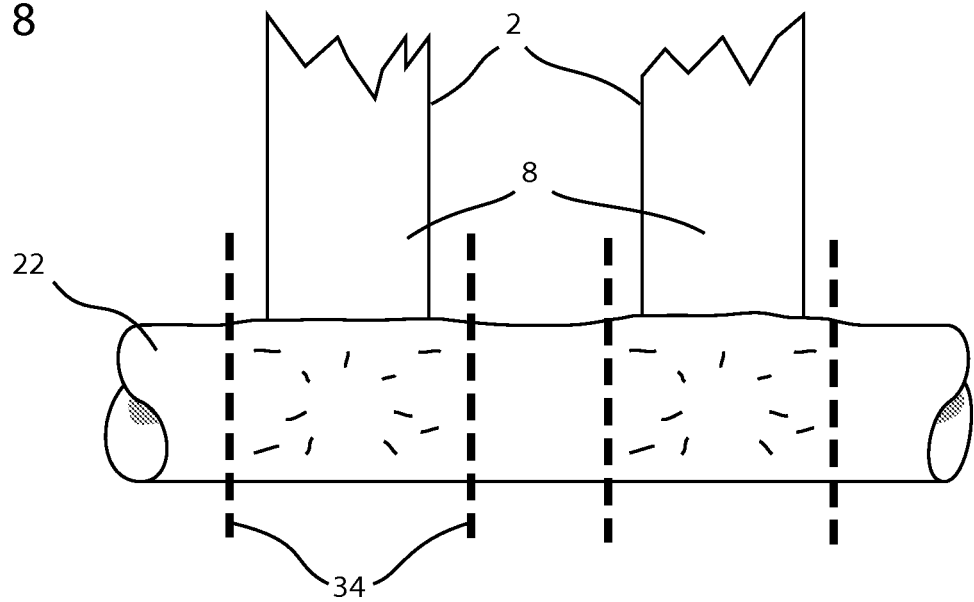
FIG. 8 shows a front view of the reflowable member and tail portions of FIGS. 5-7 and cut lines of the reflowable member.
Figure 9:
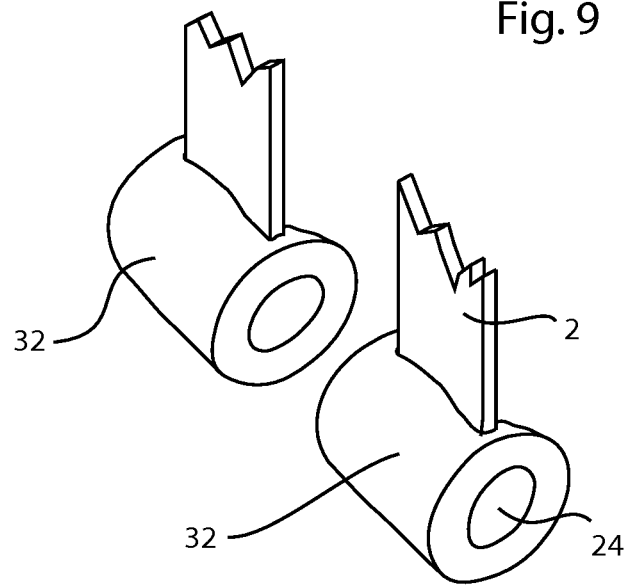
FIG. 9 shows the tail portions of FIG. 8 with cut reflowable elements.

With the solder member 22 disposed on the contacts 2, the solder can be cut into individual solder elements 32, as shown in FIG. 9. For example, the solder member 22 can be cut along cut lines 34 shown in FIG. 8 to produce the solder elements 32. Once the contacts 2 have individual solder elements 32 disposed on their respective tail portions 8, they can be used to connect a first electrical component, such as an electronic package housing, to a substrate, such as a PCB. Accordingly, the individual contacts 2 are separated from the strip 4, disposed in the housing and then connected to the substrate by reflowing the solder. Alternatively, the contacts 2 can be separated from the strip 4 before the solder member 22 is cut into the individual solder elements 32.

Figure 10:
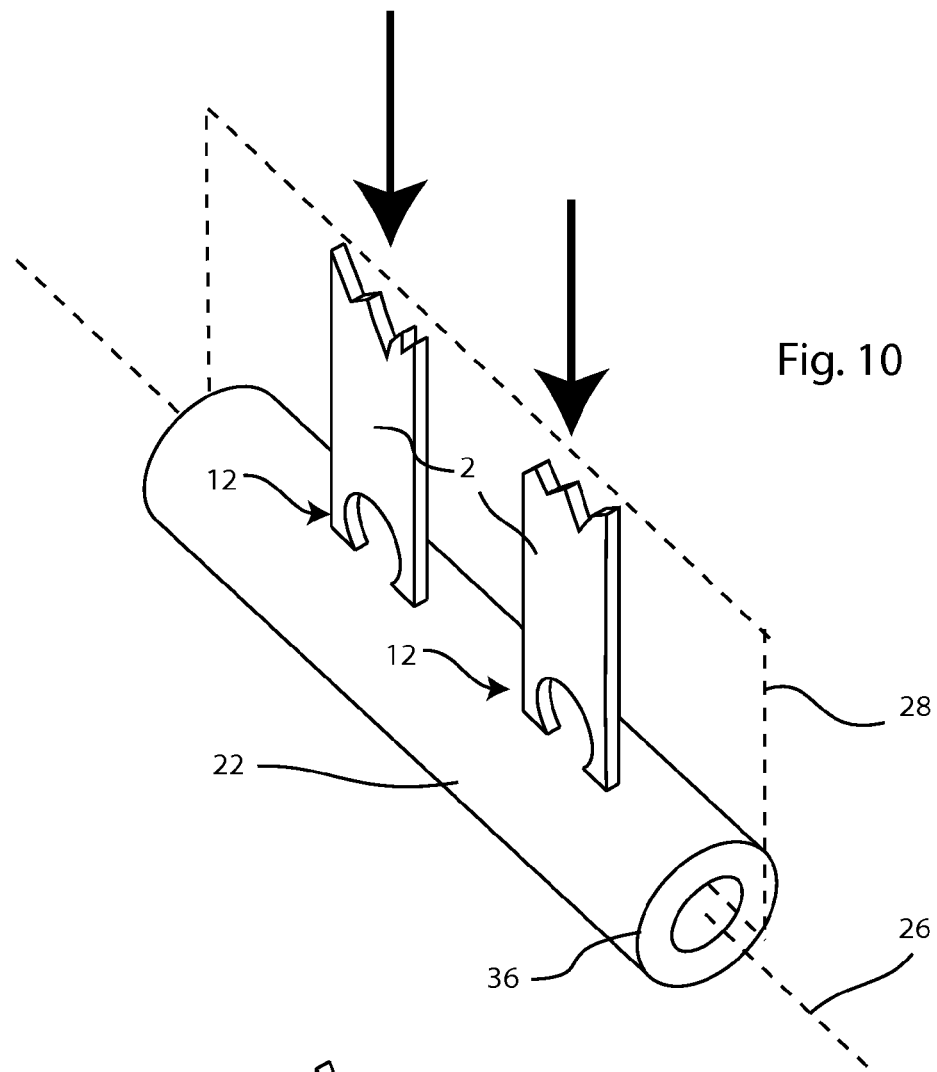
FIGS. 10 and 11 illustrate an alternative embodiment of a method of attaching the reflowable member to the tail portions.
Figure 11:
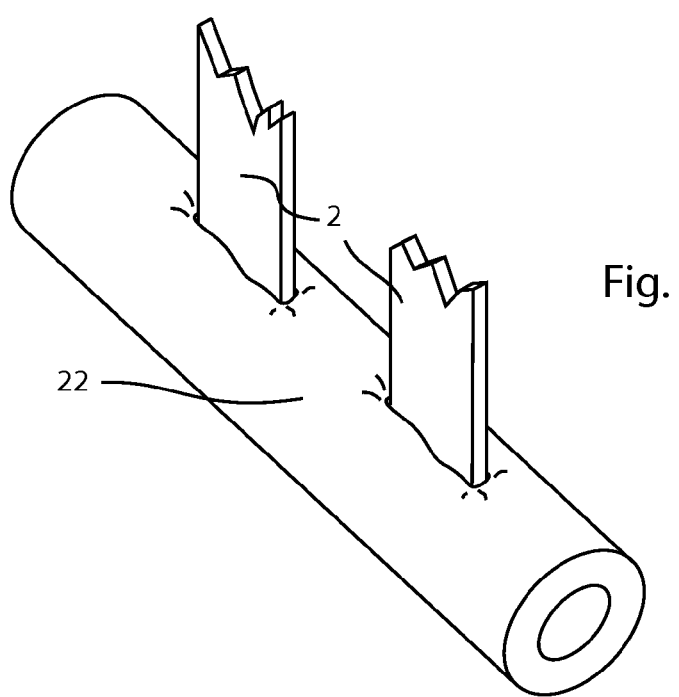

FIGS. 10 and 11 illustrate an alternative embodiment of a method of attaching the solder member 22 to the contacts 2. In this embodiment, the solder member 22 is positioned along an axis 26 that is substantially coplanar with a plane 28 of the contacts 2. The free ends 12 of the contacts 2 are disposed adjacent a surface 36 of the solder member 22 and the contacts 2 are pushed down into the solder member 22 as shown in FIG. 10. In this embodiment, the contacts 2 are pushed along the direction of the plane 28. Alternatively, the solder member 22 can be pushed onto the contacts 2 with the solder member 22 moving along the direction of the plane 28. As a result, the holding section 14 of each contact 2 is disposed within the solder member 22, as shown in FIG. 11. The contact may be positioned so that the free end 12 is disposed within the middle of the solder or the free end can be coincident with the surface of the solder member 22 at the side opposite insertion. Alternatively, the contact 2 may be pushed through the solder member 22 sufficiently that the contact passes entirely through the solder member 22 and a portion of the contact at the free end 12 extends out from the solder member at the side opposite insertion. Preferably, the malleability of the solder member is great enough that some of the solder material will move into the opening 18 disposed between the legs 16 so that the solder can be held in place by the catch or feet 20. Once the solder member 22 is attached to the tail portions 8 of the contacts 2, the solder can be cut along cut lines 34 into solder elements 32 in a similar manner as described above with respect to FIG. 8. Again, the contacts with solder elements 32 disposed thereon are used to connect first and second electrical components.

Figure 12:
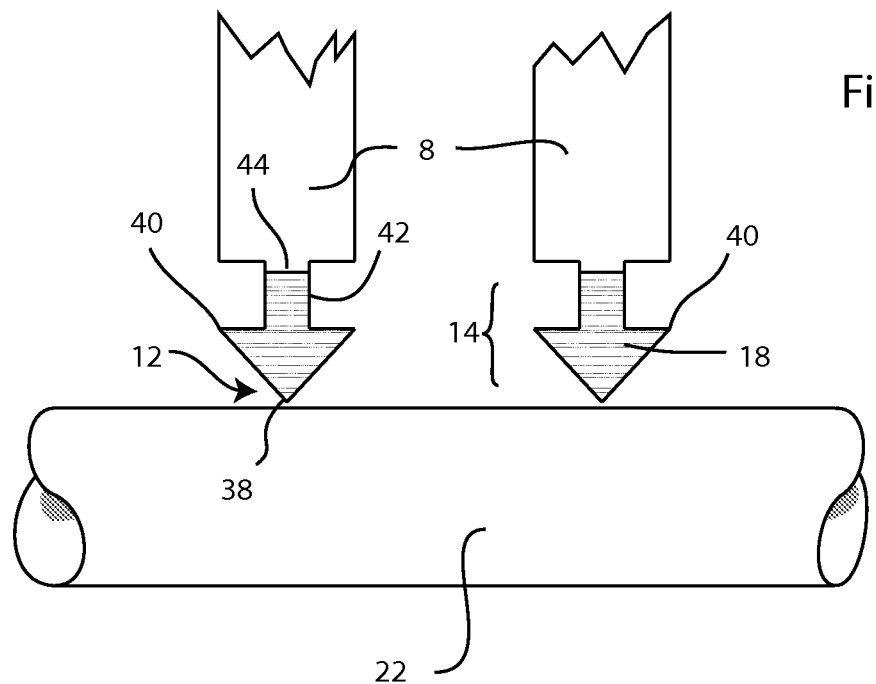
FIG. 12 shows an alternative embodiment of the tail portions in accordance with the present invention.
Figure 13:
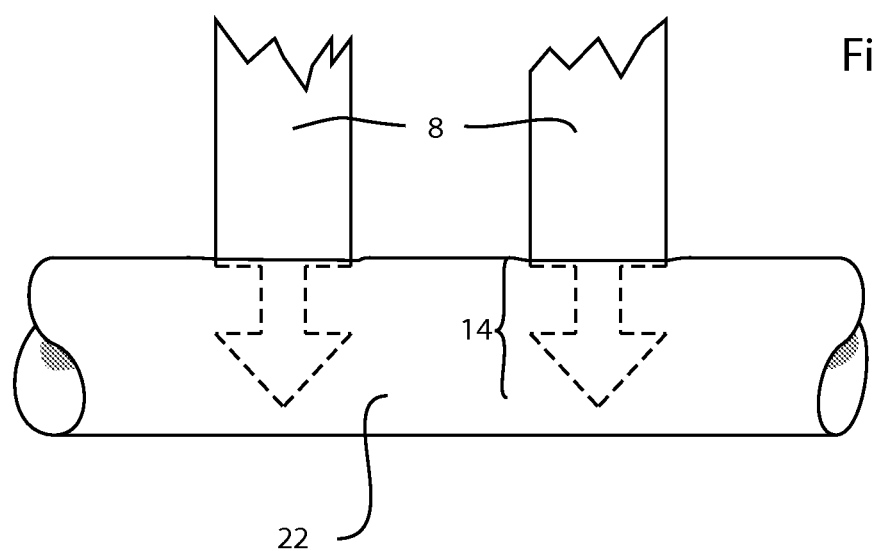
FIG. 13 shows the tail portions of FIG. 12 attached to an elongate reflowable member.

Another embodiment of contacts 2 in connection with the present invention are shown in FIGS. 12 and 13. These contacts have advantageous features for the above-described method of pushing the free ends 12 of the contacts into the solder member 22. The contacts 2 shown in FIGS. 12 and 13 have an arrowhead shape which facilitates easy insertion of the contacts 2 into the solder member. The free end 12 of the contacts 2 is in the form of a point 38 which will enter into the solder member 22 easily. From the point 38, the contact extends to a widened section including the two rear angles 40 of the arrowhead. A narrow connection section 42 connects the arrowhead to the rest of the tail portion 8 of the contact 2. In the illustrated embodiment, the holding portion 14 of the contact includes the arrowhead and the narrow connection section 42. Each of the rear angles 40 thereby act as a catch to hold the solder member 22 onto the contacts. When the contacts are inserted into the solder member 22, the solder material surrounds the narrow connection section 42 and the contacts are securely held in the solder material by the catches or wide rear angles 40 of the arrowhead.

To facilitate even easier insertion into the solder member 22 and to control solder reflow, part of the tail portions 8 can be covered with a coating or plating. For example, the insertion portion 14 of the contacts 2 shown in FIG. 2 include a tin plating 44 on the surface of the contacts. The tin plating 44 helps direct the solder reflow to a corresponding contact, for example a solder pad on a substrate. The portion of the contact 2 that does not include tin plating 44 is likely to be subject to some corrosion. As a result that portion of the contact without tin plating 44 will be more resistant to adhesion of the solder. Accordingly, the solder will reflow onto the solder pad rather than wick up the contact 2.

Figure 14:
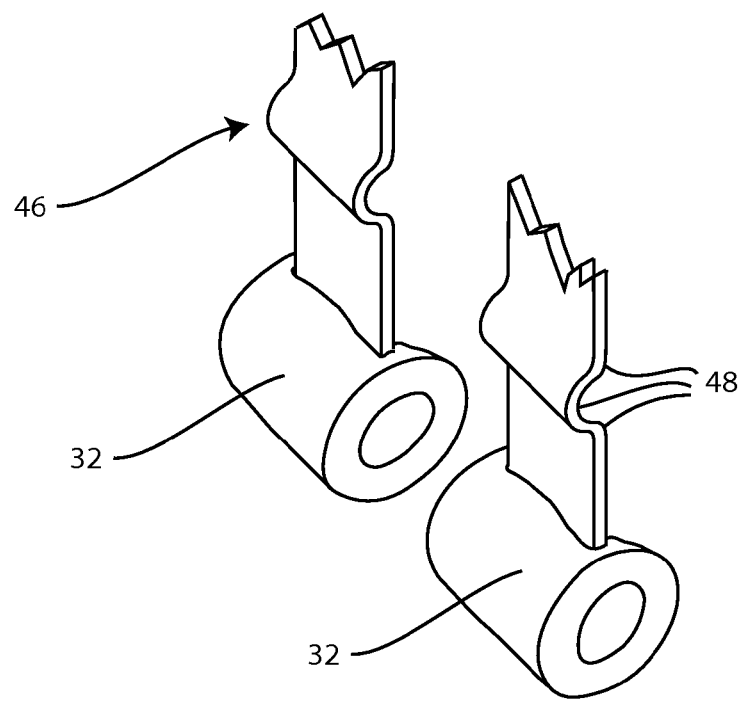
FIGS. 14 and 15 show additional embodiments of tail portions with reflowable elements attached thereto.
Figure 15:
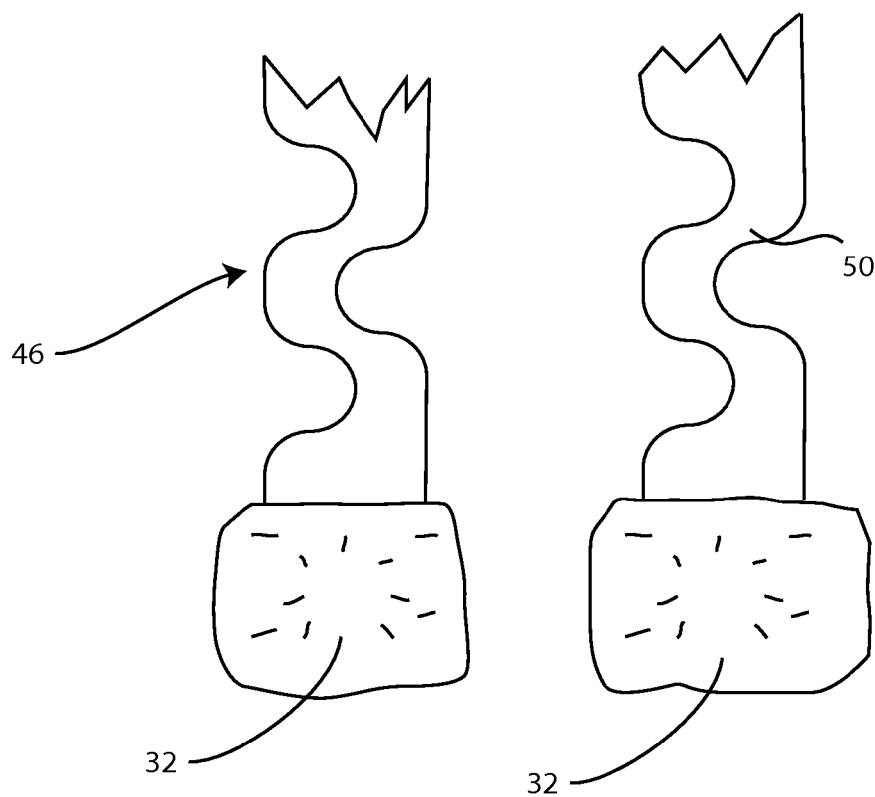

The contacts can optionally include a stress or tension relief mechanism or spring element 46 that aids in relieving mechanical stress on the solder when it is attached to a terminal such as a contact pad. Embodiments of such spring elements are shown in FIGS. 14 and 15. Generally, the tail portion 8 of each contact 2 in these embodiments can be similar to the previously described embodiments and inserted into the solder member 22, as described above. However, the contacts 2 include the spring element 46 disposed between the contact body 6 and the free end 12 of the contact. The spring element 46 can be part of the tail portion 8 or it can be a separate part of the contact 2. The spring element 46 is left outside of the solder member 22 when the tail portion 8 is inserted therein. As a result, the spring element 46 is positioned between a solder attachment to a first electrical component and a second electrical component when the components are connected. Accordingly, the mechanical stress caused by any slight movement between the electrical components is absorbed by the spring element 46. The spring element 46 can be formed by one or more bends 48 in the contact 2. Preferably, if the contacts are made from a sheet of metal or a foil, the bends are made with respect to the plane of the sheet, as shown in FIG. 14. The illustrated spring element 46 of FIG. 14 includes three bends 48 forming a pre-buckled contact. Alternatively, the spring element 46 can be stamped in the contacts, as shown in FIG. 15. For example, the spring element 46 can be provided by an undulated section 50 that is formed when the contact is stamped from a sheet of metal or a metal foil.

Figure 16:
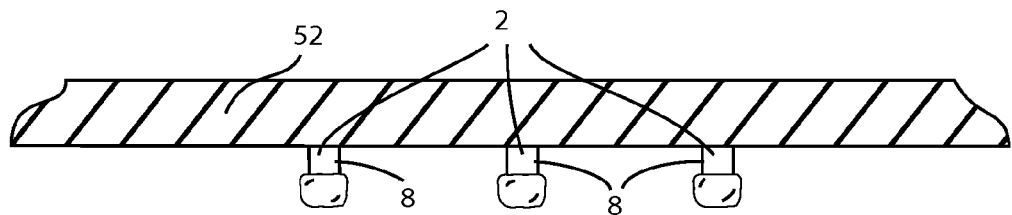
FIG. 16 shows a housing including electrical contacts with solder disposed thereon.
Figure 17:
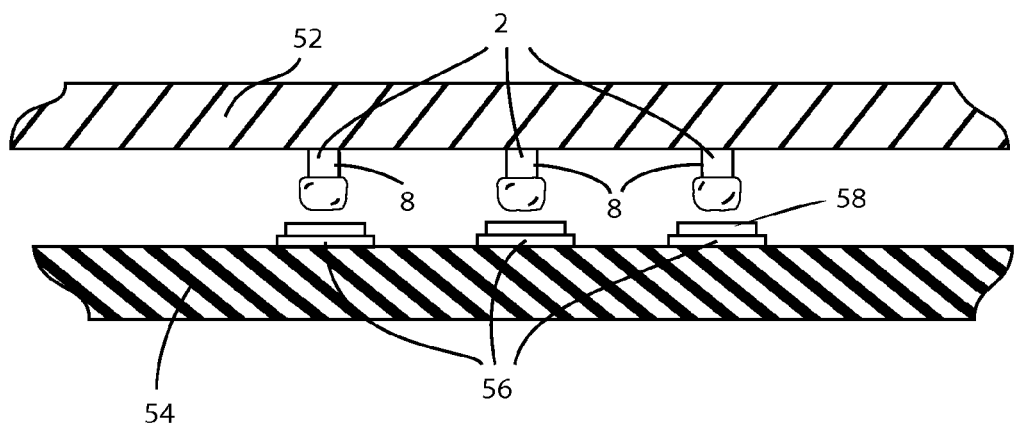
FIG. 17 shows the housing and electrical contacts of FIG. 16 in the vicinity of a substrate with substrate contacts.
Figure 18:
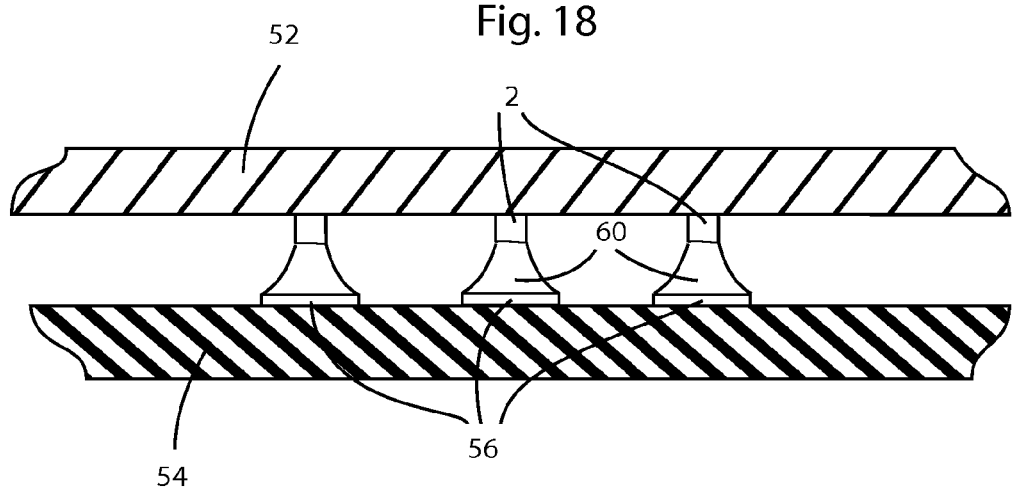
FIG. 18 shows the electrical contacts electrically connected to the substrate contacts of FIG. 17.

Once the solder elements 32 are disposed on the contacts 2, the contacts can be placed in a housing 52, for example, of an electronic package. The tail portion 8 of the contacts 2 extend out from the housing 52 with the solder elements 32 disposed away from the housing 52 as shown in FIG. 16. To attach the contacts 2 to a second device 54, the housing 52 is brought in the vicinity of the second device with the contacts 2 adjacent respective corresponding contacts 56 of the second device. In the illustrated embodiment shown in FIG. 17, the second device 54 is a substrate with solder pads 56 disposed thereon. The solder pads 56 can include a solder paste 58 disposed thereon to facilitate better adhesion between the contacts 2. The contacts 2 are then electrically attached to the solder pads 56 by heating the solder elements 32 and causing them to reflow. When the solder hardens, a solder connection 60 is provided between each contact 2 and the respective solder pad 56.

Although the preferred form of the invention has been shown and described, many features may be varied, as will readily be apparent to those skilled in this art. It is the intention, therefore, to be limited only as indicated by the scope of the claims appended hereto.

I claim:

1. An electrical connector comprising:
a planar strip;
a plurality of contacts defined in the planar strip, each contact comprising:
 a body portion; and
 a tail portion extending from the body portion, the tail portion including a holding section disposed toward a free end of the tail portion; and
a continuous solder element partially enveloping the holding section of each contact,
wherein each holding section comprises:
 a catch disposed toward a free end of the tail portion and a narrow connection section disposed between the catch and the body portion,
 wherein the catch is wider than the narrow connection section.

2. The electrical connector of claim 1, wherein the solder element, the tail portion, and the body portion each have a melting point, and wherein the melting point of the solder element is lower in temperature than the melting point of the body portion and the melting point of the tail portion.

3. The electrical connector of claim 1, further comprising: a tin plating that covers at least part of the tail portion.

4. The electrical connector of claim 1, wherein the free end of the tail portion is a point, and wherein the tail portion narrows from the catch to the free end of the tail portion.

5. The electrical connector of claim 4, wherein a portion of the tail portion from the catch to the free end of the tail portion forms an arrowhead shape.

6. The electrical connector of claim 1, wherein each contact further comprises a spring element disposed between the body portion and the tail portion.

7. The electrical connector of claim 6, wherein the spring element includes at least one bend.

8. The electrical connector of claim 1, wherein the tail portion further includes a spring element disposed between the body portion and the free end of the tail portion.

9. The electrical connector of claim 8, wherein the spring element includes at least one bend.

10. The electrical connector of claim 1, wherein the holding sections are co-planar with one another and wherein:
   the continuous solder element comprises a flux core defining an axis therethrough; and
   the continuous solder element is disposed on each holding section such that the continuous solder element axis is oriented generally parallel to the plane of the holding sections.

11. The electrical connector of claim 1, wherein:
   each holding section is disposed within the continuous solder element.

\* \* \* \* \*